(12) United States Patent
Landmark

(10) Patent No.: US 7,787,581 B2
(45) Date of Patent: Aug. 31, 2010

(54) PHASE LOCKED LOOP CIRCUITRY

(75) Inventor: Joakim Landmark, Uppsala (SE)

(73) Assignee: Infineon Technologies AG, Munich (DE)

( * ) Notice: Subject to any disclaimer, the term of this patent is extended or adjusted under 35 U.S.C. 154(b) by 826 days.

(21) Appl. No.: 11/699,111

(22) Filed: Jan. 29, 2007

(65) Prior Publication Data
US 2007/0195917 A1    Aug. 23, 2007

(30) Foreign Application Priority Data
Jan. 30, 2006    (EP) ................... 06001886

(51) Int. Cl.
*H03D 3/24*    (2006.01)
(52) U.S. Cl. ............... 375/376; 375/327; 375/373; 327/156; 455/260
(58) Field of Classification Search ............. 375/376, 375/373, 327; 327/156; 455/260
See application file for complete search history.

(56) References Cited

U.S. PATENT DOCUMENTS

| | | | |
|---|---|---|---|
| 5,892,407 A * | 4/1999 | Ishii | ............... 331/17 |
| 5,991,350 A | 11/1999 | Yamamoto | |
| 6,208,211 B1 | 3/2001 | Zipper et al. | |
| 6,580,376 B2 * | 6/2003 | Perrott | ............... 341/61 |
| 6,653,874 B2 * | 11/2003 | Ishikawa | ............... 327/144 |
| 7,409,028 B2 * | 8/2008 | Ham, III | ............... 375/376 |

FOREIGN PATENT DOCUMENTS

WO    WO 02/05428 A2    1/2002

* cited by examiner

*Primary Examiner*—Ted M Wang
(74) *Attorney, Agent, or Firm*—Eschweiler & Associates, LLC

(57) ABSTRACT

The invention relates to a phase-locked loop circuit including a phase detector, loop filter and an oscillator. The loop filter is implemented digitally instead of by means of analog components. The chip area required for such a digital loop filter is substantially smaller than an analog equivalence and can be implemented on a single integrated circuit die together with an oscillator, phase detector and possible counters. There is thus no need for the use of external components, greatly simplifying the design and manufacture of the circuit, and having reduced assemblage costs. Further, by means of the digital filter the loop dynamics are also easily changed.

10 Claims, 6 Drawing Sheets

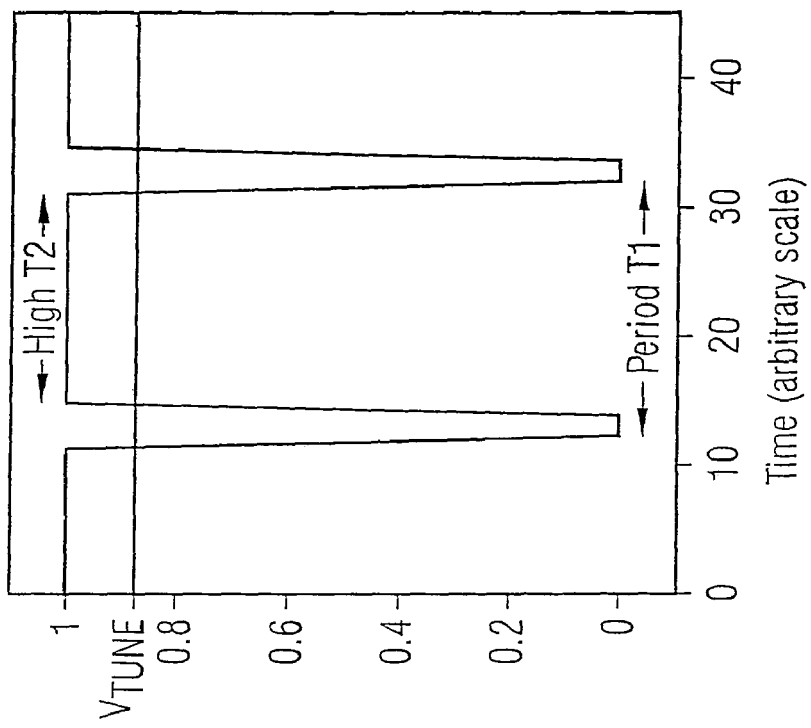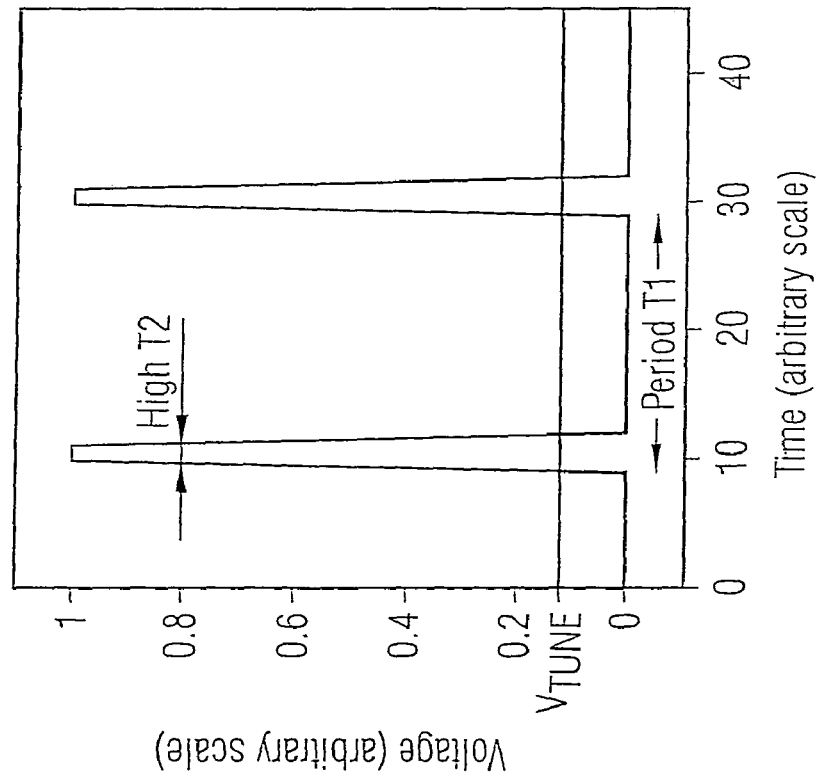

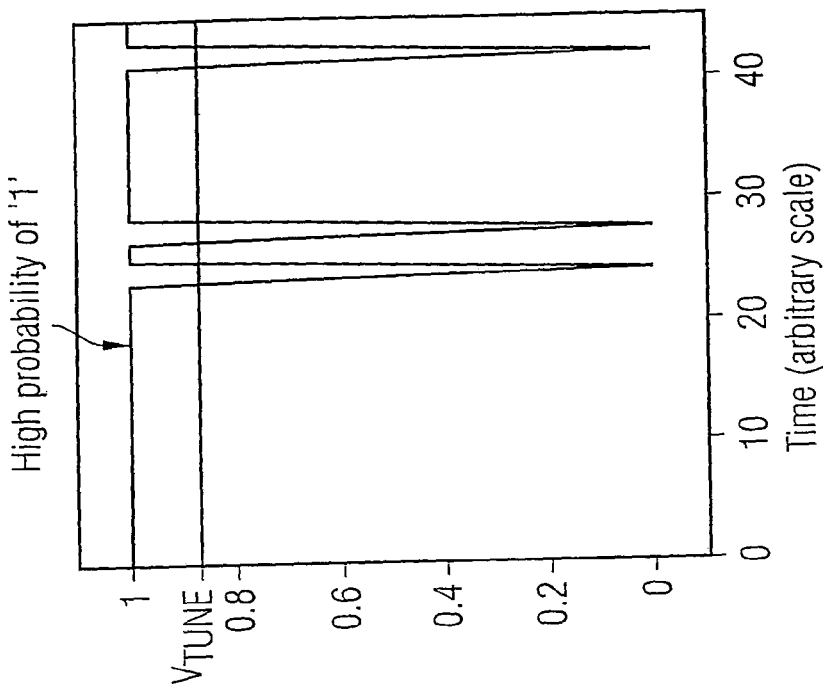
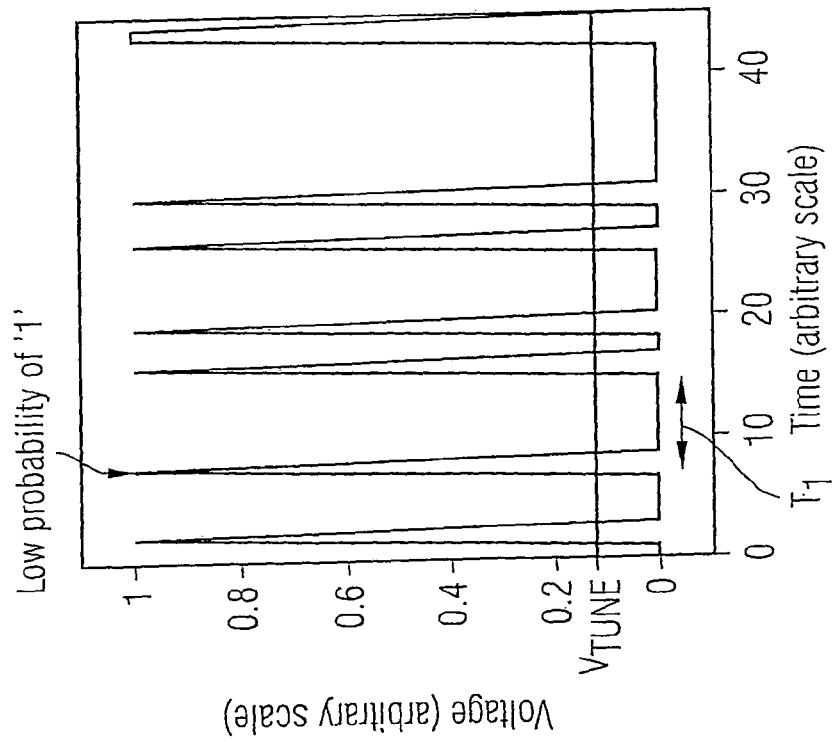

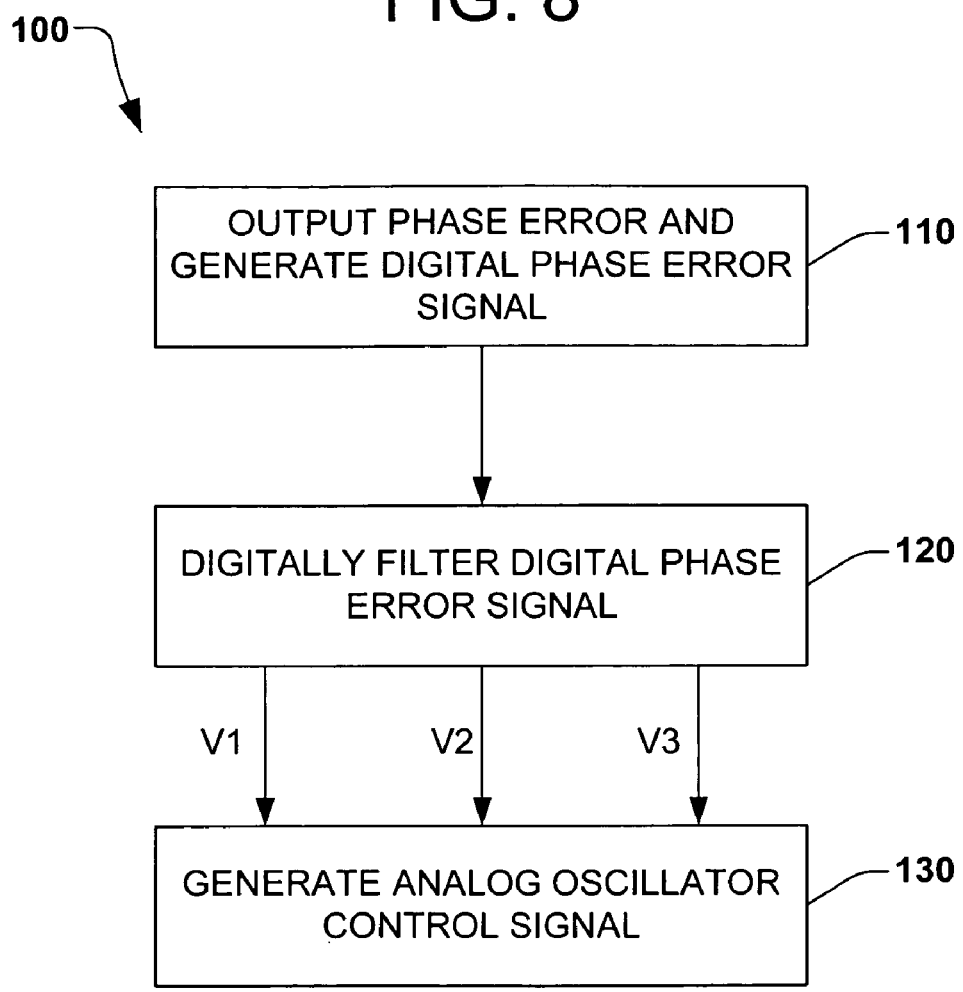

PHASE LOCKED LOOP CIRCUITRY

REFERENCE TO RELATED APPLICATIONS

This application claims the benefit of the priority date of European application EP 06 001 886.8, filed on Jan. 30, 2006, the contents of which are herein incorporated by reference in their entirety.

FIELD OF THE INVENTION

The invention generally relates to phase locked loop circuitry and to a method for controlling an oscillator in such circuitry.

BACKGROUND OF THE INVENTION

A phase locked loop (PLL) is a closed-loop feedback control system maintaining a generated signal in a fixed phase relationship to a reference signal, and is widely used in electronic devices, such as radio receivers and transmitters. FIG. 1 is a block diagram illustrating schematically the different parts of a typical PLL. The PLL 1 generally comprises a phase detector 2, a filter section 3 and a voltage-controlled oscillator (VCO) 4. There may further be a divider 5 or a divide-by-N counter in the feedback path in order to make the output of the PLL a multiple of a reference signal. The phase detector 2 receives a reference signal $S_{ref}$ and an oscillator signal $S_{OSC}$ as inputs, and its function is to compare the phases of these signals and cause the filter section 3 to change a control voltage in order to raise or lower the frequency (and hence the phase) of the oscillator 4. The output from the phase detector 2 is a control signal or error signal $S_{error}$, which is a function of the phase difference between the input reference signal $S_{ref}$ and the oscillator signal $S_{OSC}$. The filter section 3 comprises an integrator for accomplishing the speeding up or slowing down of the oscillator frequency. The integrator is conventionally implemented using a charge pump and a loop filter capacitor for low-pass filtering the output control signal.

In microelectronics, the voltage controlled oscillator 2, the divider 5 and the phase detector 2 are often integrated on a single chip and the filter section 3 or loop filter is sometimes integrated on chip and sometimes placed externally to the chip as discrete components. An exemplary prior art layout of the filter section 3 or loop filter is shown in FIG. 2. The analog loop filter 3 comprises analog components such as resistors R and capacitors C. The loop filter 3 performs an integration function, which is as mentioned above often implemented by means of a charge pump and a loop filter capacitor. Such loop filter capacitors generally need to be rather large and require therefore a substantial area on the chip.

There are several drawbacks related to such loop filters. The chip area required if implementing the loop filter on a single chip is relatively large, mainly due to the above mentioned loop capacitors. If placed outside the chip as separate components, it adds to the overall bill of material (BOM). Further, if a frequency modulation is added to the voltage controlled oscillator, care has to be taken to compensate for the loop filter dynamics, as is well known within the field. Analog components have some tolerances and it is often tedious and time consuming to trim a loop filter to the required application, entailing for example measurements of the loop filter response and calibration of the frequency modulated signal.

It would thus be desirable to provide an improved phase locked loop circuit, having a reduced size and in which the calibration of the loop filter dynamics is facilitated.

SUMMARY OF THE INVENTION

The following presents a simplified summary in order to provide a basic understanding of one or more aspects and/or embodiments of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a phase locked loop circuit having an improved filter section with reduced space requirements and having a layout enabling simplified manufacturing thereof, thereby overcoming or at least alleviating the shortcomings of the prior art. In one embodiment the invention comprises a flexible and easily manipulated phase locked loop circuit that is easily adjusted for use in any application.

In accordance with the invention a phase locked loop circuit is provided comprising a phase detector receiving as input a reference signal and an oscillator signal and detecting a phase difference between them and thereafter outputting a phase error signal based on the detected phase difference. The circuit further comprises a loop filter section connected to the phase detector and used for filtering the input error signal. The loop filter section is in turn connected to a voltage controlled oscillator, the output of which is fed back into the phase detector. In one embodiment, the loop filter section comprises a digital loop filter section comprising digital filtering means and a digital to analog converter. The loop filter of the phase-locked loop circuit is thus implemented digitally in one embodiment instead of using traditional analog components. The chip area required for such a digital loop filter is substantially smaller than an analog equivalent and can be implemented on a single integrated circuit die together with an oscillator, phase detector and possible counters. There is thus no need for the use of external components, greatly simplifying the design and manufacture of the circuit, and having reduced assembly costs. Further, by means of the digital filter the loop dynamics are also easily changed.

In accordance with one embodiment of the invention the loop filter section of the circuit further comprises an analog to digital converter connected between the phase detector and the digital filtering means. A variable solution is thus provided, enabling the use of a digital or analog phase-detector and giving the designer flexibility to choose devices best suited for a certain application.

In accordance with another embodiment of the invention the circuit further comprises an anti-alias filter between the digital to analog converter and the voltage-controlled oscillator for preventing aliasing. This filter can be implemented using only a few analog components and thus requiring only limited chip-area in one embodiment.

In accordance with yet another embodiment of the invention, the digital to analog converter is implemented so as to have a clock signal the duty cycle of which is proportional to a desired control signal $V_{TUNE}$. The control signal $V_{TUNE}$ is fed into the voltage controlled oscillator in order to adjust its frequency. In an alternative, the digital to analog converter is implemented so as to have a clock signal being a pseudorandom sequence of zeros and ones. In this embodiment the clock signal has a probability of a one being set proportional to a desired control voltage $V_{TUNE}$. In yet another alternative the digital to analog converter has a clock signal the duty cycle of which is varied pseudo-randomly for each period, and wherein the duty cycle of the clock signal is proportional to the desired control voltage $V_{TUNE}$. The digital to analog converter can thus be implemented in various ways, all in dependence on the spectral requirements of the output from the voltage controlled oscillator. If a single spurious is acceptable, the first alternative is used in one embodiment. If this is unacceptable, but an increased phase noise level can be accepted, the second alternative may be used in another embodiment. Finally, if neither spurious nor increased noise level is acceptable the third alternative could be used in still another embodiment. Again, this provides flexibility and gives the designer flexibility to choose devices best suited for a certain application.

The present invention also relates to a method for controlling an oscillator within a circuit as described above and to a transmitter comprising such circuit, whereby advantages corresponding to the above described are obtained.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 6a-6b are graphs illustrating exemplary output signals from a first alternative embodiment of a digital to analog converter.

FIGS. 7a-7b are graphs illustrating exemplary output signals from a second alternative embodiment of a digital to analog converter.

FIG. 8 is a flow chart includes various acts included in the method in accordance with the invention.

DETAILED DESCRIPTION OF PREFERRED EMBODIMENTS

Figure 1:
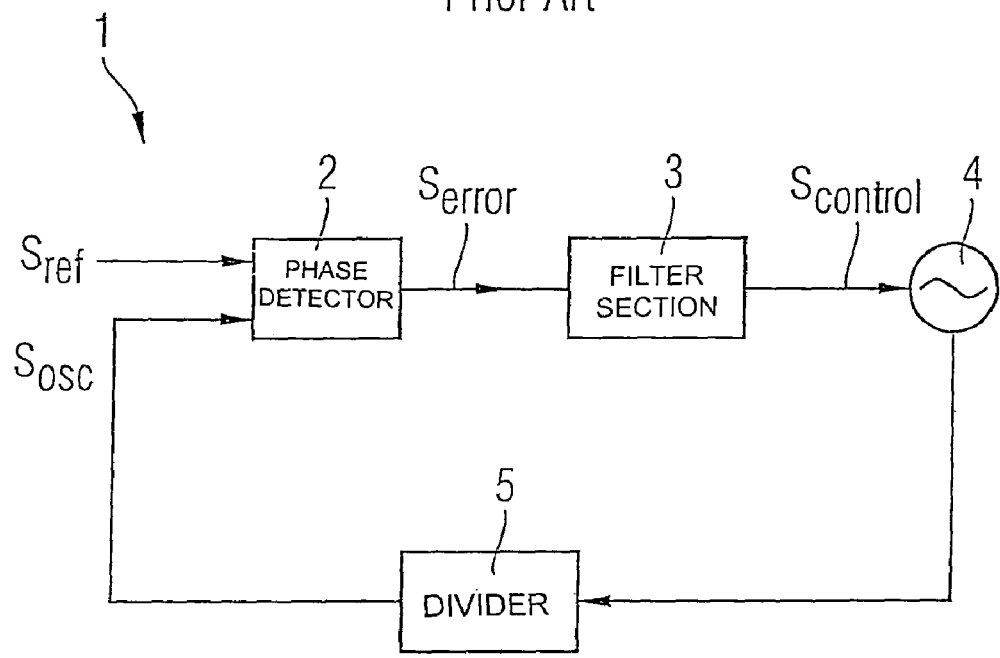
FIG. 1 is a block diagram illustrating a prior art phase locked loop.
Figure 2:
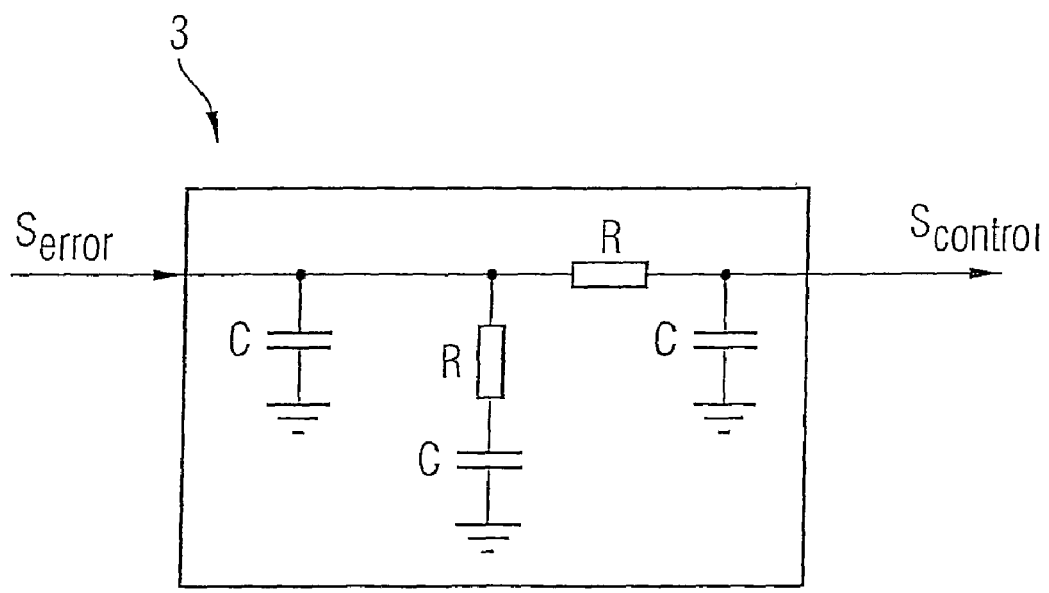
FIG. 2 illustrates a filter section of the phase locked loop of FIG. 1.

In the following description, further aspects and embodiments of the present invention are disclosed. In addition, reference is made to the accompanying drawings, which form a part hereof, and in which is shown by way of. illustration, in which the invention may be practiced. The embodiments of the drawings present a discussion in order to provide a better understanding of one or more aspects of the present invention. The disclosure is not intended to limit the features or key elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawings are not necessarily to scale relative to each other. Like reference numerals designate corresponding similar parts.

A first embodiment of the present invention is described with reference to FIG. 3. A phase locked loop 30 in accordance with one embodiment of the invention comprises a phase detector (PD) 31 for receiving as inputs a reference signal $S_{reference}$ and an oscillator signal $S_{oscillator}$ and measuring the phase difference therebetween. In one embodiment divider 37 is provided after the voltage controlled oscillator 36 for enabling a dividing of the oscillator signal $S_{oscillator}$. The phase difference detection can be performed in any suitable way, for example, by measuring the time between positive edges of the two signals. In the embodiment shown in FIG. 3, the phase detector 31 is analog and thus outputs an analog error signal $S_{error}$. However, the phase detector 31 can alternatively output a digital output, and it can, for example, be implemented by means of an exclusive OR (XOR) gate, which maintains a 90° phase difference or it can be implemented by means of a simple state machine determining which of the two signals has a zero-crossing earlier or more often.

In accordance with one embodiment of the invention, rather than using an analog filter section, a digital section 300 is provided. That is, the conventional analog filter elements of the feedback loop of the PLL are replaced with digital circuitry. Briefly, the digital section 300 comprises an analog-to-digital converter 32 (ADC) converting the analog error signal $S_{error}$ that is output from the phase detector 31 into a digital error signal $Sd_{error}$ and a digital filter section 33 for performing a digital filtering of the digital error signal $Sd_{error}$. Since the voltage controlled oscillator 36 in one embodiment requires an analog input, a digital-to-analog converter 34 (DAC) is further provided.

Figure 5A:
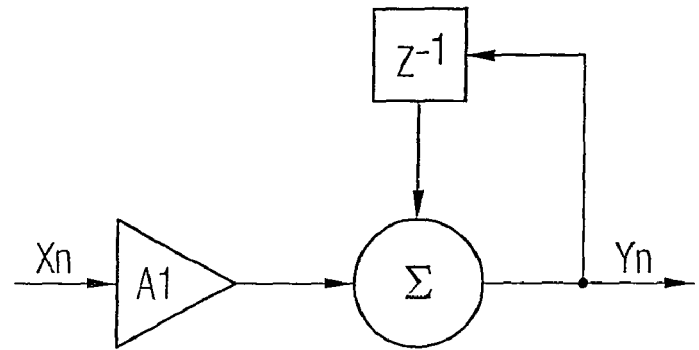
FIGS. 5a-5b are exemplary circuit diagrams suitable for use in the circuit in accordance with various embodiments of the invention.
Figure 5B:
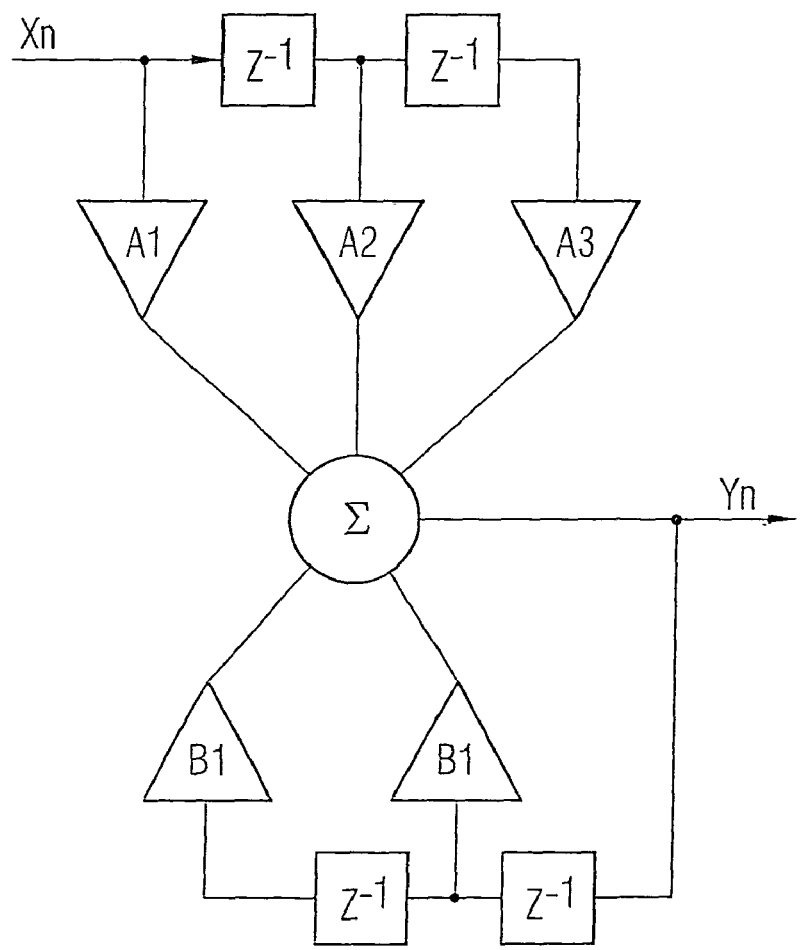

Whereas a conventional analog filter would have an analog charge pump and loop filter capacitor, the present invention utilizes a digital filter section 33. The digital filter section 33 can be implemented in any suitable manner. For example, in one embodiment the integrating function can be effectuated by means of an arrangement as shown in FIG. 5a. Another exemplary filtering function is disclosed in FIG. 5b, in which values of A1, A2, A3 and B1 can be varied in accordance with a desired result. The digital error signal $Sd_{error}$ can hence be manipulated in a desired manner. Thus, when replacing the analog filtering components, i.e. the charge pump and loop filter, with digital components, the filter path can be made adjustable or programmable in a way that an analog filter cannot.

An anti-alias filter 35 will generally be needed after the digital section 300 (after the DAC 34) for preventing aliasing, i.e. for preventing analog signals from becoming aliases of one another when sampled. An anti-aliasing filter 35 in one embodiment is analog, for example, being a low-pass filter and comprising a resistor and capacitor. However, if the update rate or sampling rate of the DAC 35 is sufficiently high the anti-aliasing filter 35 can be accomplished by means of only a few analog components, whereby the area required for implementation of the anti-aliasing filter is small.

Figure 3:
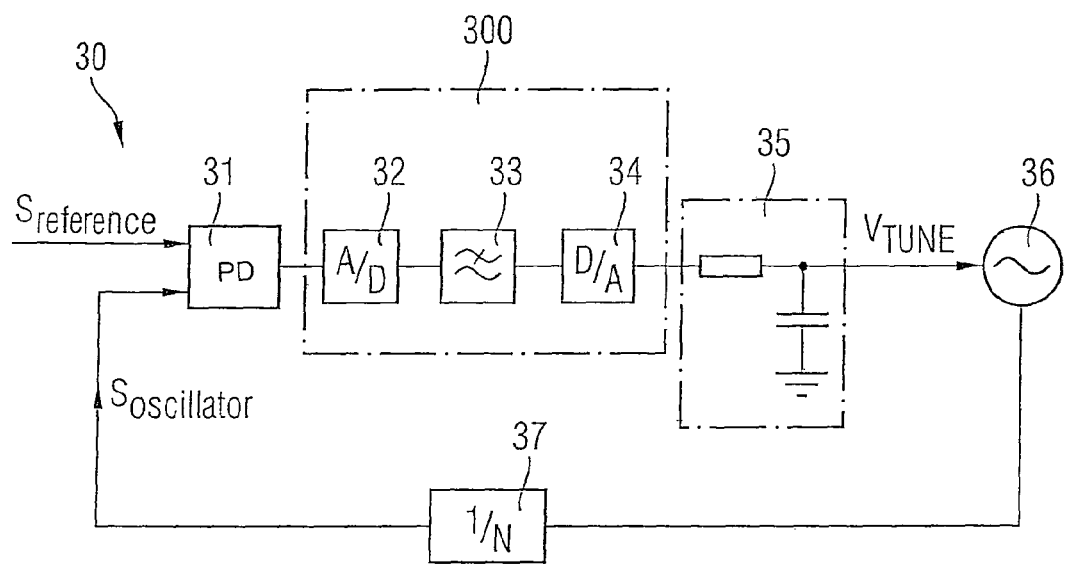
FIG. 3 illustrates an exemplary embodiment of the present invention.
Figure 4:
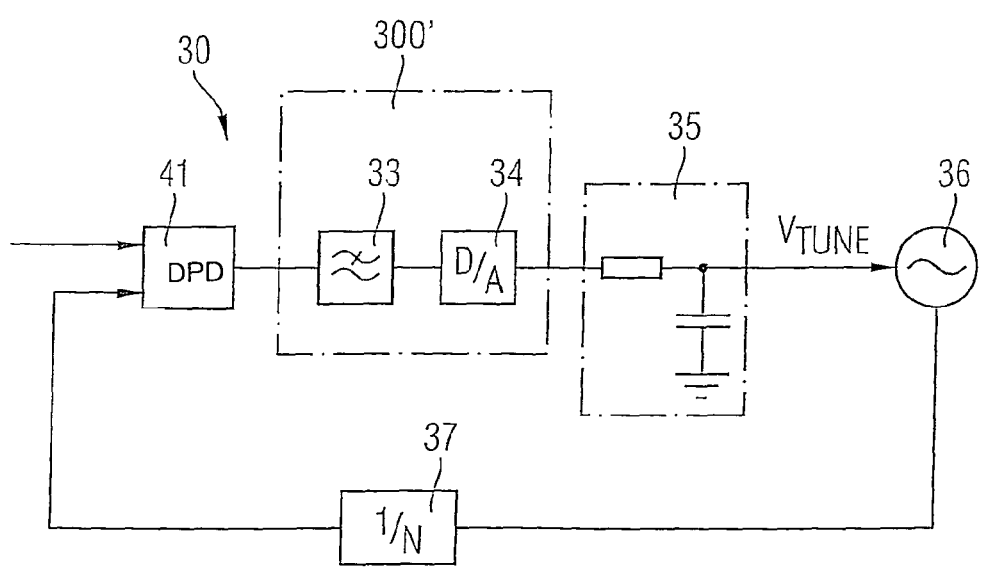
FIG. 4 illustrates another exemplary embodiment of the present invention.

In accordance with another embodiment of the invention, illustrated in FIG. 4, the ADC 32 of the phase locked loop 30 of FIG. 3 is omitted, resulting in the digital filter section 300'. The phase detector 41 is in this embodiment implemented as a digital phase detector (DPD), outputting directly a digital error signal $Sd_{error}$, which digitally encodes the phase difference between the reference signal $S_{reference}$ and the VCO 36 output clock signal. Such digital phase detector 41 can, for example, be implemented as a XOR gate, as was mentioned above, thereby eliminating the need for an ADC 32.

Next, the digital to analog converter DAC 34 according to one embodiment will be described. In short, the DAC 34 receives as input the digital representation of the digitally filtered control signal, which is based on the input phase error, converts this digital representation into an analog signal and outputs an analog control signal $V_{TUNE}$. The DAC 34 of both embodiments and the ADC 32 of the embodiment shown in FIG. 3 are a 1-bit DAC and ADC, respectively, in one embodiment. Generally, a one-bit DAC is a circuit that translates a binary number into a pulse train whose duty cycle, that is, the fraction of time that the signal is high, is proportional to the binary input. In the present case, the binary input is the digital control signal $Sd_{control}$. This pulse train is then converted into an analog signal by averaging it over time with a low-pass filter. The output from the 1-bit DAC is thus a stream of pulses or a bit stream. The frequency of the bit stream decides the complexity and size of the filter design, and therefore the DAC 34 in accordance with one embodiment of the invention is a one-bit DAC.

It is understood that a four-bit DAC or a DAC having any other resolution (n-bit) can be utilized in alternative embodiments. However, by using a one-bit converter 32, 34 in one embodiment the complexity and space requirements of the circuitry are minimized, thereby improving the overall BOM of the phase locked loop circuit 30. The noise level of a one-bit DAC is dependent upon the speed at which it operates and the lower noise levels that are required the higher clock speeds are needed. The update rate of the converters 32, 34 should be so high in one embodiment as to enable the use of a simple one pole analog filter, that is, an analog filter having one capacitor and one resistor. The one pole analog filter should be able to reduce the spurious emissions caused by the update rate without influencing the loop dynamics.

In accordance with one embodiment of the invention, the 1-bit DAC 34 can be implemented in several different ways depending on the spectral requirements of the VCO 36. More specifically, in accordance with one embodiment of the invention, the duty cycle of the DAC 34 can be implemented in various ways, which will now be described.

In accordance with a first alternative embodiment, if a single spurious voltage is acceptable in view of the spectral requirements of the VCO 36, the DAC 34 can be implemented as a high frequency digital clock signal having a frequency $1/T_1$ and with a duty cycle that is proportional to the desired control signal $V_{TUNE}$, that is $V_{TUNE} = T_2/T_1$, where $T_2$ is the on-time or period of time that the value of the signal is a "1" or high. The fundamental of the clock will be filtered in the analog filter but some amplitude will be left causing a single tone spurious at each side of the carrier. FIGS. 6a and 6b illustrate exemplary output signals. FIG. 6a shows a control signal $V_{TUNE}$ having a low value. The duty cycle has the above-described on-time with a short period $T_2$ and the off-time accordingly has a longer period $T_1-T_2$, whereby the output from the DAC represent the desired control signal $V_{TUNE}$. FIG. 6b shows a $V_{TUNE}$ having a high value. The on-time therefore has a longer period $T_2$ and the off-time has a shorter period $T_1-T_2$, whereas $V_{TUNE}$ is of course still $T_2/T_1$.

Another alternative embodiment of the DAC is to implement the DAC as clock signal having a pseudo-random sequence of zeros and ones with a probability of a one being set proportional to the desired control voltage $V_{TUNE}$. This embodiment can advantageously be used if a single spur is unacceptable, and would yield no discrete spurs. However, this embodiment would give an increased phase noise level and thus an increased adjacent channel interference. Exemplary output signals are shown in FIGS. 7a-7b. FIG. 6a illustrates, in a fashion similar to the above-described alternative, the case when the control signal, $V_{TUNE}$, is low, and FIG. 7b illustrates the case when it is high.

A third alternative embodiment of the DAC, suitable if no spurious are acceptable, nor an increased phase noise level close to the carrier, is presented next. The DAC is in this embodiment implemented as a high frequency clock signal where the period $T_1$ is varied pseudo-randomly for each period. The period $T_1$ can be set to be varied within a certain predetermined range, as is suitable for the application in question. The duty cycle of the signal is still proportional to the desired control voltage $V_{TUNE}$. The output signals will be similar to the graphs illustrated in FIGS. 6a and 6b, but the period $T_1$ is varied for each period. This will result in a spurious energy that is smeared out in a frequency band centered around $1/\text{average}(T_1)$. The width of the band where the energy is smeared out is dependent on how much and how fast $T_1$ is changed.

FIG. 8 is a flow chart illustrating acts included in the method in accordance with the invention. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

The method 100 for controlling an oscillator 36 in a phase-locked loop circuit as described above, comprises outputting, from the phase detector 31, 41, a phase error signal $S_{error}$ and generating a digital representation of the phase error signal $S_{error}$ at 110. Next, at 120, the digital phase error signal $S_{error}$ is filtered digitally by means of the digital filter section 300, 300'. Subsequently, at 130 an analog oscillator control signal $V_{TUNE}$ corresponding to the digitally filtered phase error signal $S_{error}$ is generated by the digital to analog converter 34. In generating an analog oscillator control signal $V_{TUNE}$, the digital to analog conversion can entail implementing the digital to analog converter 34 in different ways, as indicated by the three arrows $V_1$, $V_2$ and $V_3$ between acts 120 and 130. More specifically, the digital to analog converter 34 can have a clock signal the duty cycle of which is proportional to the desired output control signal $V_{TUNE}$; it can have a clock signal being a pseudo-random sequence of zeros and ones, wherein the clock signal has a probability of a one being set proportional to a desired control signal $V_{TUNE}$; or it can have a clock signal the duty period of which is varied pseudo-randomly for each period and wherein the duty cycle of the clock signal is again proportional to the desired control signal $V_{TUNE}$. The control signal $V_{TUNE}$ is thereafter input to the voltage controlled oscillator 36 for adjusting its frequency as required.

In summary, by means of the digital loop filter in accordance with the invention a phase locked loop requiring a reduced chip area or BOM can be accomplished. Further, the trimming and/or calibration of the circuit if a modulation is to be added to the VCO 36 can be minimised. Yet another benefit of using a digital filter is that it is easy to accomplish changes of loop dynamics, if such need should arise, and the present invention thus provides a more flexible phase-locked loop circuitry.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

The Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A phase-locked loop circuit, comprising:
   a phase detector configured to receive an input reference signal, and a feedback signal, and detect a phase difference therebetween, and output a phase error signal based on the detected phase difference;
   a loop filter section configured to filter the phase error signal;
   a voltage controlled oscillator configured to generate an output signal as a function of the filtered phase error signal, and provide the feedback signal associated therewith via a divider circuit,
   wherein the loop filter section comprises a digital loop filter section comprising digital filtering means to filter the phase error signal, and a digital to analog converter configured to convert the filtered phase error signal to an analog filtered phase error signal,
   wherein the digital to analog converter is configured to generate a clock signal comprising a pseudo-random sequence of zeros and ones, and further configured to average the clock signal over a time period to form the clock signal, wherein a probability of the clock signal being a one is proportional to a desired control signal $V_{TUNE}$, wherein the control signal $V_{TUNE}$ is fed into the voltage controlled oscillator in order to adjust a frequency of the output signal and the feedback signal associated therewith.

2. The phase-locked loop circuit of claim 1, wherein the loop filter section further comprises an analog to digital converter connected between the phase detector and the digital filtering means, and configured to convert the phase error signal to a digital phase error signal.

3. The phase-locked loop circuit of claim 1, further comprising an anti-alias filter provided between the digital to analog converter and the voltage-controlled oscillator, and configured to prevent aliasing in the analog filtered phase error signal.

4. A phase-locked loop circuit, comprising:
   a phase detector configured to receive an input reference signal, and a feedback signal, and detect a phase difference therebetween, and output a phase error signal based on the detected phase difference;
   a loop filter section configured to filter the phase error signal;
   a voltage controlled oscillator configured to generate an output signal as a function of the filtered phase error signal, and provide the feedback signal associated therewith via a divider circuit,
   wherein the loop filter section comprises a digital loop filter section comprising digital filtering means to filter the phase error signal, and a digital to analog converter configured to convert the filtered phase error signal to an analog filtered phase error signal,
   wherein the digital to analog converter is configured to generate a clock signal comprising a duty period that is varied pseudo-randomly for each period, and wherein the duty cycle of the clock signal is proportional to a control signal $V_{TUNE}$, and further configured to average the clock signal over a time period to form the control signal $V_{TUNE}$, wherein the control signal $V_{TUNE}$ is fed into the voltage controlled oscillator in order to adjust a frequency of the output signal and the feedback signal associated therewith.

5. Method for controlling an oscillator in a phase-locked loop circuit, the phase-locked loop circuit comprising a phase detector configured to receive an input reference signal, and a feedback signal, and detect a phase difference therebetween, and output a phase error signal based on the detected phase difference, a loop filter section configured to filter the phase error signal, a voltage controlled oscillator configured to generate an output signal as a function of a control signal, and provide the feedback signal associated therewith via a divider circuit, the method comprising:
   outputting from the phase detector the phase error signal and generating a digital representation of the phase error signal;
   digitally filtering the digital phase error signal using the loop filter; and
   generating an analog oscillator control signal corresponding to the digitally filtered phase error signal, and providing the analog oscillator control signal to the voltage controlled oscillator for generation of the output signal based thereon,
   wherein generating the analog oscillator control signal comprises generating a clock signal comprising a pseudo-random sequence of zeros and ones, wherein a probability of the clock signal being a one is proportional to a desired control signal $V_{TUNE}$, and averaging the clock signal over a time period to form the analog oscillator control signal.

6. Method for controlling an oscillator in a phase-locked loop circuit, the phase-locked loop circuit comprising a phase detector configured to receive an input reference signal, and a feedback signal, and detect a phase difference therebetween, and output a phase error signal based on the detected phase difference, a loop filter section configured to filter the phase error signal, a voltage controlled oscillator configured to generate an output signal as a function of a control signal, and provide the feedback signal associated therewith via a divider circuit, the method comprising:
   outputting from the phase detector the phase error signal and generating a digital representation of the phase error signal;
   digitally filtering the digital phase error signal using the loop filter; and
   generating an analog oscillator control signal corresponding to the digitally filtered phase error signal, and providing the analog oscillator control signal to the voltage controlled oscillator for generation of the output signal based thereon,
   wherein generating the analog oscillator control signal comprises generating a clock signal comprising a duty period that is varied pseudo-randomly for each period, and wherein the duty cycle of the clock signal is proportional to the analog oscillator control signal $V_{TUNE}$, and averaging the clock signal over a time period to form the analog oscillator control signal.

7. A phase locked loop circuit, comprising:
a phase detector configured to compare a reference signal with a feedback signal, and generate a phase error signal in response thereto;
a loop filter configured to digitally filter the phase error signal and generate a control signal corresponding therewith;
a voltage controlled oscillator configured to generate an output signal based on the control signal; and
a divider circuit configured to divide the output signal and generate the feedback signal based thereon,
wherein the loop filter comprises:
an analog to digital converter configured to convert the phase error signal into a digital phase error signal;
a digital filter configured to digitally filter the digital phase error signal; and
a digital to analog converter configured to convert the digitally filtered digital phase error signal into the control signal, wherein the digital to analog converter is configured to translate a binary number from the digital filter into a clock signal comprising a pseudo-random sequence of zeros and ones with a probability of a one being related to the control signal, and average the clock signal over a time period to form an analog signal comprising the control signal.

8. A phase locked loop circuit, comprising:
a phase detector configured to compare a reference signal with a feedback signal, and generate a phase error signal in response thereto;
a loop filter configured to digitally filter the phase error signal and generate a control signal corresponding therewith;
a voltage controlled oscillator configured to generate an output signal based on the control signal; and
a divider circuit configured to divide the output signal and generate the feedback signal based thereon,
wherein the loop filter comprises:
an analog to digital converter configured to convert the phase error signal into a digital phase error signal;
a digital filter configured to digitally filter the digital phase error signal; and
a digital to analog converter configured to convert the digitally filtered digital phase error signal into the control signal, wherein the digital to analog converter is configured to translate a binary number from the digital filter into a clock signal comprising a clock period that is varied pseudo-randomly for each period, wherein the duty cycle average is related to the control signal, and average the clock signal over a time period to form an analog signal comprising the control signal.

9. A phase-locked loop circuit, comprising:
a phase detector configured to receive an input reference signal, and a feedback signal, and detect a phase difference therebetween, and output a phase error signal based on the detected phase difference;
a loop filter section configured to filter the phase error signal;
a voltage controlled oscillator configured to generate an output signal as a function of the filtered phase error signal, and provide the feedback signal associated therewith via a divider circuit,
wherein the loop filter section comprises a digital loop filter section comprising digital filtering means to filter the phase error signal, and a digital to analog converter configured to convert the filtered phase error signal to an analog filtered phase error signal,
wherein the digital to analog converter is configured to generate a clock signal comprising a pseudo-random sequence of zeros and ones, and further configured to average the clock signal over a time period to form a control signal $V_{TUNE}$, wherein a probability of the clock signal being a one is proportional to the control signal $V_{TUNE}$, wherein the control signal $V_{TUNE}$ is fed into the voltage controlled oscillator in order to adjust a frequency of the output signal and the feedback signal associated therewith.

10. Method for controlling an oscillator in a phase-locked loop circuit, the phase-locked loop circuit comprising a phase detector configured to receive an input reference signal, and a feedback signal, and detect a phase difference therebetween, and output a phase error signal based on the detected phase difference, a loop filter section configured to filter the phase error signal, a voltage controlled oscillator configured to generate an output signal as a function of a control signal, and provide the feedback signal associated therewith via a divider circuit, the method comprising:
outputting from the phase detector the phase error signal and generating a digital representation of the phase error signal;
digitally filtering the digital phase error signal using the loop filter; and
generating an analog oscillator control signal corresponding to the digitally filtered phase error signal, and providing the analog oscillator control signal to the voltage controlled oscillator for generation of the output signal based thereon,
wherein generating the analog oscillator control signal comprises generating a clock signal comprising a pseudo-random sequence of zeros and ones, wherein a probability of the clock signal being a one is proportional to the analog oscillator control signal, and averaging the clock signal over a time period to form the analog oscillator control signal.

* * * * *

UNITED STATES PATENT AND TRADEMARK OFFICE
CERTIFICATE OF CORRECTION

PATENT NO. : 7,787,581 B2
APPLICATION NO. : 11/699111
DATED : August 31, 2010
INVENTOR(S) : Joakim Landmark It is certified that error appears in the above-identified patent and that said Letters Patent is hereby corrected as shown below:

Column 8, claim 6, line 65; please replace "oscillator control signal $V_{TUNE}$"

With --oscillator control signal--

Signed and Sealed this

Ninth Day of November, 2010

David J. Kappos
*Director of the United States Patent and Trademark Office*